United States Patent
Uetani et al.

(10) Patent No.: US 10,749,099 B2
(45) Date of Patent: Aug. 18, 2020

(54) PIEZOELECTRIC ELEMENT

(71) Applicant: NGK INSULATORS, LTD., Nagoya-Shi (JP)

(72) Inventors: Masayuki Uetani, Nagoya (JP); Takatomo Ogata, Nagoya (JP); Akifumi Morishita, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 724 days.

(21) Appl. No.: 15/473,989

(22) Filed: Mar. 30, 2017

(65) Prior Publication Data

US 2017/0288126 A1    Oct. 5, 2017

(30) Foreign Application Priority Data

Mar. 30, 2016 (JP) .................................. 2016-069145

(51) Int. Cl.
*H01L 41/047* (2006.01)
*H01L 41/083* (2006.01)
*H01L 41/297* (2013.01)

(52) U.S. Cl.
CPC ...... *H01L 41/0838* (2013.01); *H01L 41/0471* (2013.01); *H01L 41/297* (2013.01)

(58) Field of Classification Search
CPC  H01L 41/0838; H01L 41/0471; H01L 41/297
USPC .................................................. 310/311–371
See application file for complete search history.

(56) References Cited

U.S. PATENT DOCUMENTS

| | | | | |
|---|---|---|---|---|
| 7,262,546 B2* | 8/2007 | Namerikawa | ....... | H01L 41/0831 310/328 |
| 7,405,510 B2* | 7/2008 | Kaminski | ............... | H01L 41/04 310/334 |
| 2004/0207296 A1* | 10/2004 | Namerikawa | ....... | H01L 41/0831 310/367 |
| 2013/0084199 A1 | 4/2013 | Tanaka et al. | | |

FOREIGN PATENT DOCUMENTS

| | | |
|---|---|---|
| JP | 2004-158494 A1 | 6/2004 |
| JP | 2013-077754 A | 4/2013 |
| JP | 5743000 B1 | 7/2015 |

* cited by examiner

*Primary Examiner* — Thomas M Dougherty
(74) *Attorney, Agent, or Firm* — Burr & Brown, PLLC

(57) ABSTRACT

The piezoelectric element comprises a piezoelectric body extending in a lateral direction and a first and second electrodes that are provided on the piezoelectric body. The piezoelectric body has an active portion sandwiched between the first and second electrodes in a thickness direction that is vertical to the lateral direction, and an inactive portion connected to the active portion in the lateral direction. The first electrode has an active electrode portion disposed on the active portion. The active electrode portion includes an interface region that is adjacent to the interface of the active portion and the inactive portion in the lateral direction, and an inner region that is separated from the interface of the active portion and the inactive portion in the lateral direction. The cross sectional surface area per unit length of the interface region in the cross section of the active electrode portion is greater than the cross sectional area per unit length of the inner region.

7 Claims, 8 Drawing Sheets

COMPARATIVE EXAMPLE 1

PIEZOELECTRIC ELEMENT

BACKGROUND OF THE INVENTION

1. Field of the Invention

The present invention relates to a piezoelectric element.

2. Description of Related Art

A typical piezoelectric element is known that comprises a piezoelectric body configured from a piezoelectric ceramic material and a pair of electrodes provided on the piezoelectric body. Japanese Patent Application Laid-Open No. 2004-158494 discloses a procedure of forming an outer peripheral portion of an electrode in a network configuration and forming a central portion of the electrode in a membrane configuration for the purpose of reducing stress produced on the interface between an active portion and an inactive portion of the piezoelectric body.

SUMMARY OF THE INVENTION

Technical Problem

However, the procedure disclosed in JP-A-2004-158494 has the problem that there is a tendency for disconnections to occur on the outer peripheral portion of the electrode when an outer peripheral portion of an electrode is formed in a network configuration to a degree to enable a sufficient reduction in the stress produced in the interface between an active portion and an inactive portion of the piezoelectric body.

Consequently, there is a need for a new procedure to enable inhibition of stress produced on the interface between an active portion and an inactive portion of the piezoelectric body.

The present invention is proposed based on the new insight above, and has the object of providing a piezoelectric element that enables inhibition of stress produced on an interface between an active portion and an inactive portion of a piezoelectric body.

Solution to Problem

The piezoelectric element according to the present invention comprises a piezoelectric body extending in a lateral direction and first and second electrodes that are provided on the piezoelectric body. The piezoelectric body has an active portion sandwiched between the first and second electrodes in a thickness direction that is vertical to the lateral direction, and an inactive portion connected to the active portion in the lateral direction. The first electrode has an active electrode portion disposed on the active portion. The active electrode portion includes an interface region that is adjacent to the interface of the active portion and the inactive portion in the lateral direction, and an inner region that is separated from the interface of the active portion and the inactive portion in the lateral direction. The cross sectional surface area per unit length of the interface region in the cross section of the active electrode portion is greater than the cross sectional area per unit length of the inner region.

Effect of Invention

According to the present invention, it is possible to provide a piezoelectric element that enables inhibition of stress produced on the interface between the active portion and the inactive portion of the piezoelectric body.

DETAILED DESCRIPTION OF THE INVENTION

Configuration of Piezoelectric Element 1
(1) Overview

Figure 1:
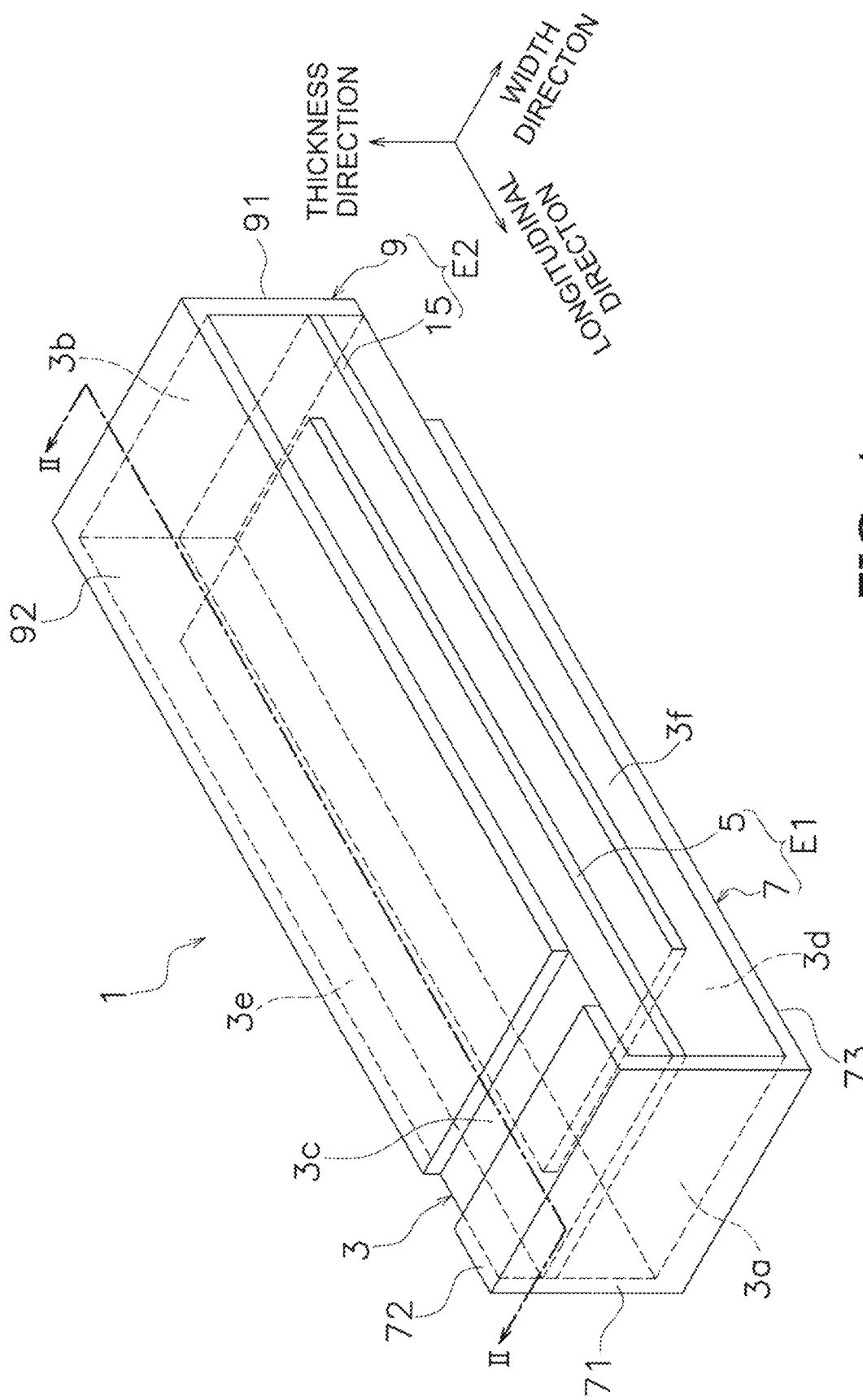
FIG. 1 is a perspective view illustrating a configuration of a piezoelectric element.

FIG. 1 is a perspective view illustrating a configuration of a piezoelectric element 1 according to the present embodiment. The piezoelectric element 1 comprises a piezoelectric body 3, and a first electrode E1 and a second electrode E2. The first electrode E1 comprises a first inner electrode 5 and a first outer electrode 7. The second electrode E2 comprises a second inner electrode 15 and a second outer electrode 9. The piezoelectric element 1 for example finds suitable application as an actuator for driving a head slider provided on a head suspension of a hard disk device (HDD). The piezoelectric element 1 according to the present embodiment can be driven by an applied field of greater than or equal to 0.4 kV/mm.

(2) Piezoelectric Body 3

The piezoelectric body 3 is formed in a substantially solid rectangular shape that extends in a longitudinal direction. The piezoelectric body 3 comprises a pair of end surfaces 3a, 3b and a pair of first side surfaces 3c, 3d and a pair of second side surfaces 3e, 3f. The pair of end surfaces 3a, 3b, the pair of first side surfaces 3c, 3d and the pair of second side surfaces 3e, 3f form the surfaces of the piezoelectric body 3. The pair of end surfaces 3a, 3b is vertical relative to the longitudinal direction, and is mutually opposed. The pair of first side surfaces 3c, 3d extends parallel to the longitudinal direction, and is mutually opposed. The pair of second side surfaces 3e, 3f extends parallel to the longitudinal direction, and is mutually opposed. The pair of second side surfaces 3e, 3f is orthogonal to the pair of first side surfaces 3c, 3d.

The piezoelectric body 3 is configured by a piezoelectric ceramic material. The piezoelectric ceramic material for example includes lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, sodium potassium niobate, strontium bismuth tantalate, and mixtures thereof. The piezoelectric ceramic material may include addition of an oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like.

(3) First Electrode E1

The first inner electrode 5 is embedded in the piezoelectric body 3. The first inner electrode 5 is formed parallel to the pair of first side surfaces 3c, 3d. The first inner electrode 5 is formed in a tabular shape. The first inner electrode 5 is exposed on the end surface 3a, and not exposed on the end surface 3b. The first inner electrode 5 is respectively exposed on the pair of second side surfaces 3e, 3f. The first inner electrode 5 may be configured for example by Pt. There is no particular limitation on the thickness of the first inner electrode 5 and it may be configured for example as 0.5 µm to 3.0 µm.

The first outer electrode 7 comprises a first electrode portion 71, a second electrode portion 72 and a third electrode portion 73. The first electrode portion 71 is disposed on the end surface 3a. The first electrode portion 71 substantially covers the entire portion of the end surface 3a. The second electrode portion 72 is disposed on the first side surface 3c. The second electrode portion 72 covers the first end of the first side surface 3c. The third electrode portion 73 is disposed on the first side surface 3d. The third electrode portion 73 covers at least half of the first side surface 3d. The third electrode portion 73 is opposed to the second inner electrode 15. The first electrode portion 71, the second electrode portion 72 and the third electrode portion 73 are integrally formed. The first electrode portion 71 is connected to the first inner electrode 5 that is exposed on the end surface 3a. The first electrode portion 71, the second electrode portion 72 and the third electrode portion 73 for example may be configured by Pt. There is no particular limitation in relation to the respective thicknesses of the first electrode portion 71, the second electrode portion 72 and the third electrode portion 73 and it may be configured for example as 0.5 µm to 3.0 µm.

(4) Second Electrode E2

The second inner electrode 15 is embedded in the piezoelectric body 3. The second inner electrode 15 is formed parallel to the pair of first side surfaces 3c, 3d. The second inner electrode 15 is disposed between the first inner electrode 5 and the third electrode portion 73. The second inner electrode 15 is formed in a tabular shape. The second inner electrode 15 is exposed on the end surface 3b, and not exposed on the end surface 3a. The second inner electrode 15 is respectively exposed on the pair of second side surfaces 3e, 3f. The second inner electrode 15 may be configured for example by Pt. There is no particular limitation on the thickness of the second inner electrode 15 and it may be configured for example as 0.5 µm to 3.0 µm.

The second outer electrode 9 comprises a first electrode portion 91 and a second electrode portion 92. The first electrode portion 91 is disposed on the end surface 3b. The first electrode portion 91 substantially covers the entire portion of the end surface 3b. The second electrode portion 92 is disposed on the first side surface 3c. The second electrode portion 92 covers at least half of the first side surface 3c. The second electrode portion 92 is opposed to the first inner electrode 5. The first electrode portion 91 and the second electrode portion 92 are integrally formed. The first electrode portion 91 is connected to the second inner electrode 15 that is exposed on the end surface 3b. The first electrode portion 91 and the second electrode portion 92 for example may be configured by Pt. There is no particular limitation in relation to the respective thicknesses of the first electrode portion 91 and the second electrode portion 92 and it may be configured for example as 0.5 µm to 3.0 µm.

Configuration of Piezoelectric Body 3, First Electrode E1 and Second Electrode E2

Figure 2:
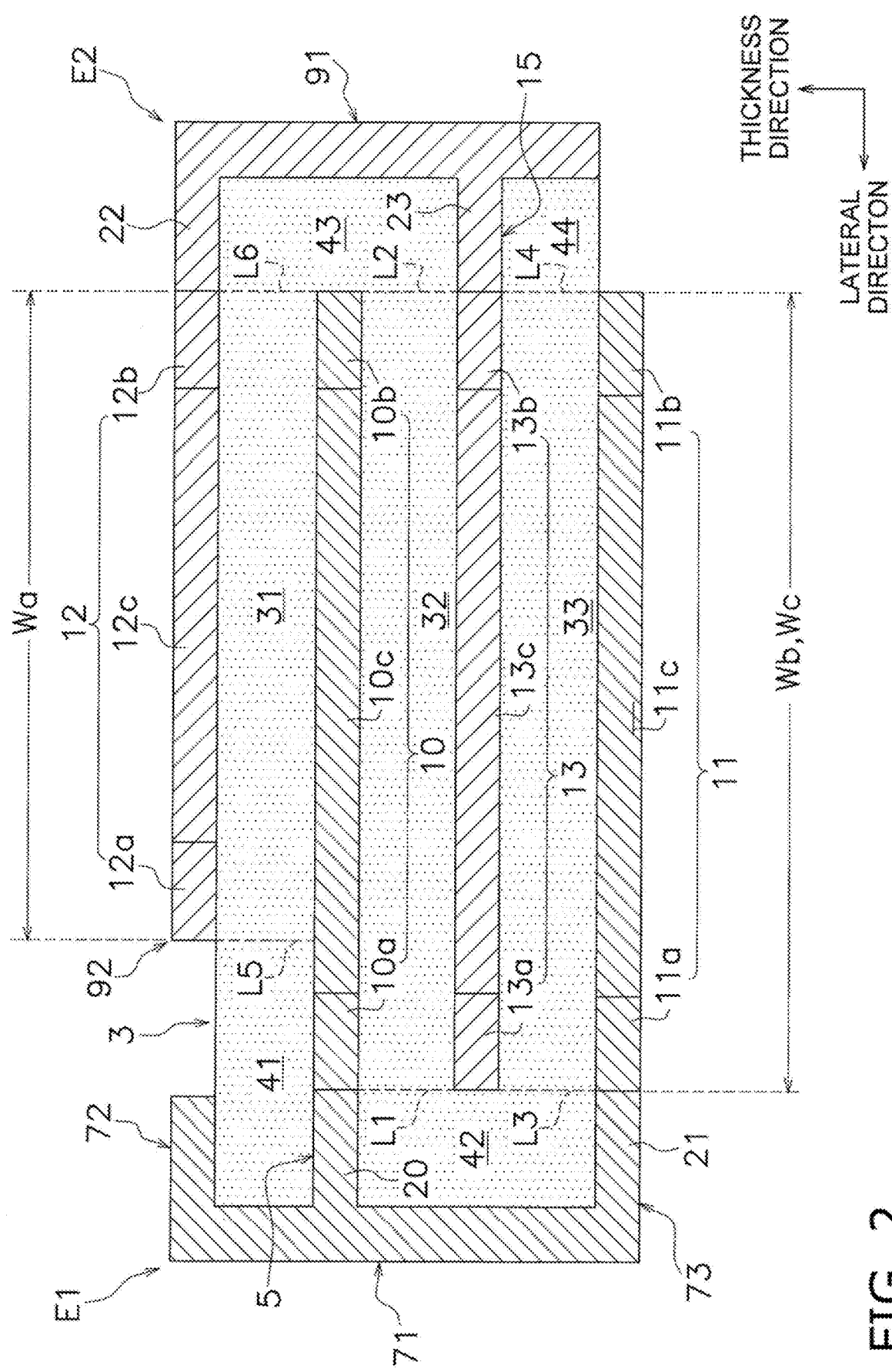
FIG. 2 is a cross-sectional view along II-II in FIG. 1.

FIG. 2 is a cross-sectional view along II-II in FIG. 1. The configuration of the piezoelectric body 3, the first electrode E1 and the second electrode E2 will be described below making reference to FIG. 2.

(1) Piezoelectric Body 3

The piezoelectric body 3 is formed to extend in a lateral direction. In the present embodiment, the lateral direction is the direction that is parallel respectively to the pair of first side surfaces 3c, 3d. The lateral direction shown in FIG. 2 is the direction that is the same as the longitudinal direction of the piezoelectric body 3. The piezoelectric body 3 comprises first to third active portions 31 to 33 and first to fourth inactive portions 41 to 44.

The respective active portions 31 to 33 are regions of the piezoelectric body 3 that are sandwiched between the first electrode E1 and the second electrode E2 in the direction of thickness that is vertical to the lateral direction. The respective active portions 31 to 33 are positions that can displace in response to an applied electrical field. The respective inactive portions 41 to 44 are regions of the piezoelectric body 3 that are not sandwiched between the first electrode E1 and the second electrode E2 in the direction of thickness. The respective inactive portions 41 to 44 do not substantially displace since an electrical field is not applied.

The first active portion 31 is sandwiched between the first inner electrode 5 of the first electrode E1 and the second electrode portion 92 of the second electrode E2 in the direction of thickness. The first active portion 31 displaces when a voltage is applied to the first inner electrode 5 and the second electrode portion 92. The second active portion 32 is sandwiched between the first inner electrode 5 of the first electrode E1 and the second inner electrode 15 of the second electrode E2 in the direction of thickness. The second active portion 32 displaces when a voltage is applied to the first inner electrode 5 and the second inner electrode 15. The third active portion 33 is sandwiched between the third electrode portion 73 of the first electrode E1 and the second inner electrode 15 of the second electrode E2 in the direction of thickness. The third active portion 33 displaces when a voltage is applied to the third electrode portion 73 and the second inner electrode 15. There is no particular limitation on the thickness of the respective active portions 31 to 33, with a thickness of at least 15 µm being preferred and at least 20 µm still more preferred in order to increase the displacement resulting from a 90 degree domain rotation as described below.

The first inactive portion 41 is connected to one end of the first active portion 31 in the lateral direction. The first inactive portion 41 is integrally connected to the first active portion 31. The second inactive portion 42 is connected to one end respectively of the second active portion 32 and the third active portion 33 in the lateral direction. The second inactive portion 42 is integrally connected to the second active portion 32 and the third active portion 33.

The third inactive portion 43 is connected respectively to one other end of the first active portion 31 and second active portion 32 in the lateral direction. The third inactive portion 43 is integrally connected to the first active portion 31 and second active portion 32. The fourth inactive portion 44 is connected to the other end respectively of the third active portion 33 in the lateral direction. The fourth inactive portion 44 is integrally connected to the third active portion 33.

(2) First Electrode E1

The first inner electrode 5 of the first electrode E1 has an active electrode portion 10 and an inactive electrode portion 20. The active electrode portion 10 is disposed on the second active portion 32. The active electrode portion 10 includes a first interface region 10a, a second interface region 10b and an inner region 10c. The first interface region 10a is adjacent to the interface L1 of the second active portion 32 and the second inactive portion 42 in the lateral direction. The length of the first interface region 10a in the lateral direction is 10% (Wb×0.1) of the length Wb of the second active portion 32. The second interface region 10b is provided on an opposite side to the first interface region 10a in a lateral direction. The second interface region 10b is adjacent to the interface L2 of the second active portion 32 and the third inactive portion 43 in the lateral direction. The length of the second interface region 10b in the lateral direction is 10% (Wb×0.1) of the length Wb of the second active portion 32. The inner region 10c is provided between the first interface region 10a and the second interface region 10b. The length of the inner region 10c in the lateral direction is 80% (Wb×0.8) of the length Wb of the second active portion 32. The inactive electrode portion 20 is disposed on the second inactive portion 42. The length of the inactive electrode portion 20 in the lateral direction is suitably adjusted in response to the length of the second inactive portion 42. The position of the interface of the active electrode portion 10 (first interface region 10a) and the inactive electrode portion 20 in the lateral direction matches with the position of the interface L1 of the second active portion 32 and the second inactive portion 42.

The third inner electrode 73 of the first electrode E1 has an active electrode portion 11 and an inactive electrode portion 21. The active electrode portion 11 is disposed on the third active portion 33. The active electrode portion 11 includes a first interface region 11a, a second interface region 11b and an inner region 11c. The first interface region 11a is adjacent to the interface L3 of the third active portion 33 and the second inactive portion 42 in the lateral direction. The length of the first interface region 11a in the lateral direction is 10% (Wc×0.1) of the length Wc of the third active portion 33. The second interface region 11b is provided on an opposite side to the first interface region 11a in a lateral direction. The second interface region 11b is adjacent to the interface L4 of the third active portion 33 and the fourth inactive portion 44 in the lateral direction. The length of the second interface region 11b in the lateral direction is 10% (Wc×0.1) of the length Wc of the third active portion 33. The inner region 11c is provided between the first interface region 11a and the second interface region 11b. The length of the inner region 11c in the lateral direction is 80% (Wc×0.8) of the length Wc of the third active portion 33. The inactive electrode portion 21 is disposed on the second inactive portion 42. The length of the inactive electrode portion 21 in the lateral direction is suitably adjusted in response to the length of the second inactive portion 42. The position of the interface of the active electrode portion 11 (first interface region 11a) and the inactive electrode portion 21 in the lateral direction matches with the position of the interface L3 of the third active portion 33 and the second inactive portion 42.

(3) Second Electrode E2

The second electrode portion 92 of the second electrode E2 has an active electrode portion 12 and an inactive electrode portion 22. The active electrode portion 12 is disposed on the first active portion 31. The active electrode portion 12 includes a first interface region 12a, a second interface region 12b and an inner region 12c. The first interface region 12a is adjacent to the interface L5 of the first active portion 31 and the first inactive portion 41 in the lateral direction. The length of the first interface region 12a in the lateral direction is 10% (Wa×0.1) of the length Wa of the first active portion 31. The second interface region 12b is provided on an opposite side to the first interface region 12a in a lateral direction. The second interface region 12b is adjacent to the interface L6 of the first active portion 31 and the third inactive portion 43 in the lateral direction. The length of the second interface region 12b in the lateral direction is 10% (Wa×0.1) of the length Wa of the first active portion 31. The inner region 12c is provided between the first interface region 12a and the second interface region 12b. The length of the inner region 12c in the lateral direction is 80% (Wa×0.8) of the length Wa of the first active portion 31. The inactive electrode portion 22 is disposed on the third inactive portion 43. The length of the inactive electrode portion 22 in the lateral direction is suitably adjusted in response to the length of the third inactive portion 43. The position of the interface of the active electrode portion 12 (second interface region 12b) and the inactive electrode portion 22 in the lateral direction matches with the position of the interface L6 of the first active portion 31 and the third inactive portion 43.

The second inner electrode 15 of the second electrode E2 has an active electrode portion 13 and an inactive electrode portion 23. The active electrode portion 13 is disposed on the third active portion 33. The active electrode portion 12 includes a first interface region 13a, a second interface region 13b and an inner region 13c. The first interface region 13a is adjacent to the interface L3 of the third active portion 33 and the second inactive portion 42 in the lateral direction. The length of the first interface region 13a in the lateral direction is 10% (Wc×0.1) of the length Wc of the third active portion 33. The second interface region 13b is provided on an opposite side to the first interface region 13a in a lateral direction. The second interface region 13b is adjacent to the interface L4 of the third active portion 33 and the fourth inactive portion 44 in the lateral direction. The length of the second interface region 13b in the lateral direction is 10% (Wc×0.1) of the length Wc of the third active portion 33. The inner region 13c is provided between the first interface region 13a and the second interface region 13b. The length of the inner region 13c in the lateral direction is 80% (Wc×0.8) of the length Wc of the third active portion 33. The inactive electrode portion 23 is disposed on the fourth inactive portion 44. The length of the inactive electrode portion 23 in the lateral direction is suitably adjusted in response to the length of the fourth inactive portion 44. The position of the interface of the active electrode portion 13 (second interface region 13b) and the inactive electrode portion 23 in the lateral direction coincides with the position of the interface L4 of the third active portion 33 and the fourth inactive portion 44.

Configuration of Active Electrode Portion 10 to 13

The configuration of the active electrode portions 10 to 13 will be described below.

As described above, the active electrode portions 10 to 13 have a mutually similar configuration. Therefore, the active electrode portion 12 of the second electrode portion 92 will be described below as a representative of the active electrode portions 10 to 13. Furthermore, the first interface region 12a and the second interface region 12b of the active electrode portion 12 have a mutually similar configuration. Therefore, the first interface region 12a will be described below as a representative of the first interface region 12a and the second interface region 12b.

(1) First Interface Region 12a

Figure 3:
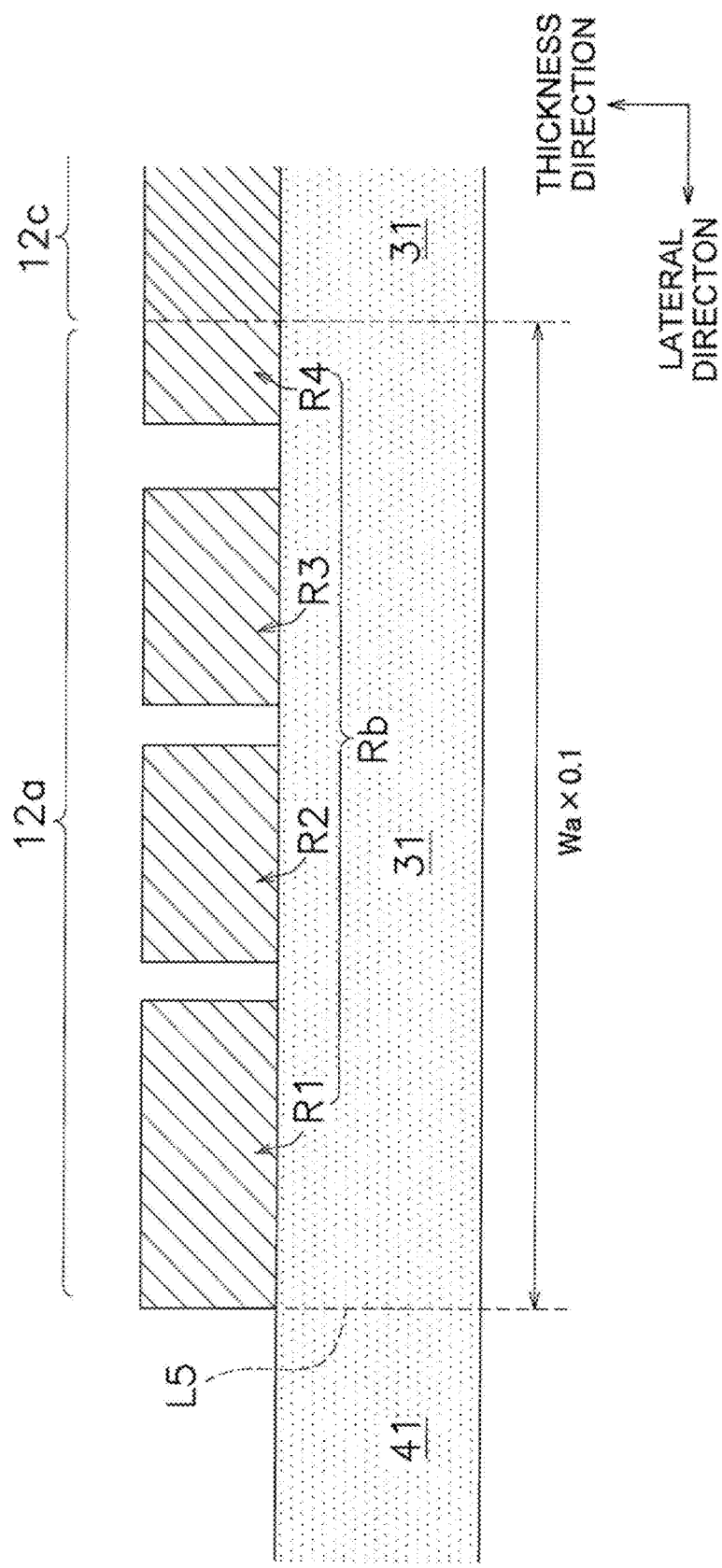
FIG. 3 is a partially enlarged view of FIG. 2.

FIG. 3 is a partially enlarged view of FIG. 2. FIG. 3 schematically illustrates a section view of the first interface region 12a.

The first interface region 12a is a region that is adjacent to the interface L5 of the first active portion 31 and the first inactive portion 41 in the lateral direction of the active electrode portion 12 of the second electrode portion 92. The length of the first interface region 12a in the lateral direction is 10% (Wa×0.1) of the length Wa of the first active portion 31. The first interface region 12a is connected to the inner region 12c.

In the present embodiment, the first interface region 12a is formed intermittently. The first interface region 12a is not formed in the configuration of a continuous layer. The first interface region 12a partially covers the surface of the first active portion 31. The coverage Pa of the surface of the first active portion 31 by the first interface region 12a is less than 100%. The coverage Pa of the surface of the first active portion 31 by the first interface region 12a may be at least 80%, is preferably at least 85%, more preferably at least 90% and still more preferably at least 95%. The coverage Pa of the surface of the first active portion 31 by the first interface region 12a is the proportion of the total contact length of the first active portion 31 relative to the total length (Wa×0.1) of the first interface region 12a based on an SEM (Scanning Electron Microscope) image of the first interface region 12a.

The first interface region 12a has a cross sectional area Ra ($\mu m^2/\mu m$) per unit length in the lateral direction. The cross sectional area Ra ($\mu m^2/\mu m$) per unit length is calculated in the following manner.

Firstly, an SEM image of the cross section of the first interface region 12a is obtained. Next, image processing software PickMap (URL: http://fishers.dtdns.net/software/pickmap/index.html#1) is used to adjust the threshold to an RGB average value so that only the first interface region 12a on the SEM image is extracted and thereby obtain a binarized SEM image.

Next, the image processing software PickMap is used to calculate the total cross sectional area of the first interface region 12a. In FIG. 3, the total cross sectional surface area of the first interface region 12a is the total of R1, R2, R3 and R4.

Then the cross sectional area Rc ($\mu m^2/\mu m$) per unit length is calculated by dividing the total cross sectional surface area Rb by the length (Wa×0.1) of the first interface region 12a. In FIG. 3, the cross sectional surface area Rc per unit length ($\mu m^2/\mu m$) is the total of (R1+R2+R3+R4)/(Wa×0.1). Furthermore, the cross sectional area Rc ($\mu m^2/\mu m$) per unit length in the four cross sections is calculated in the same manner. The total of five cross sections are cross sections obtained by equally dividing the first interface region 12a into six portions in a transverse direction that is orthogonal to the longitudinal direction (direction that is vertical with respect to the face of the page in FIG. 3).

The value calculated as the arithmetic mean of the cross sectional area Rc ($\mu m^2/\mu m$) per unit length calculated respectively from the five cross sections is the cross sectional area Ra ($\mu m^2/\mu m$) per unit length of the first interface region 12a.

(2) Inner Region 12c

Figure 4:
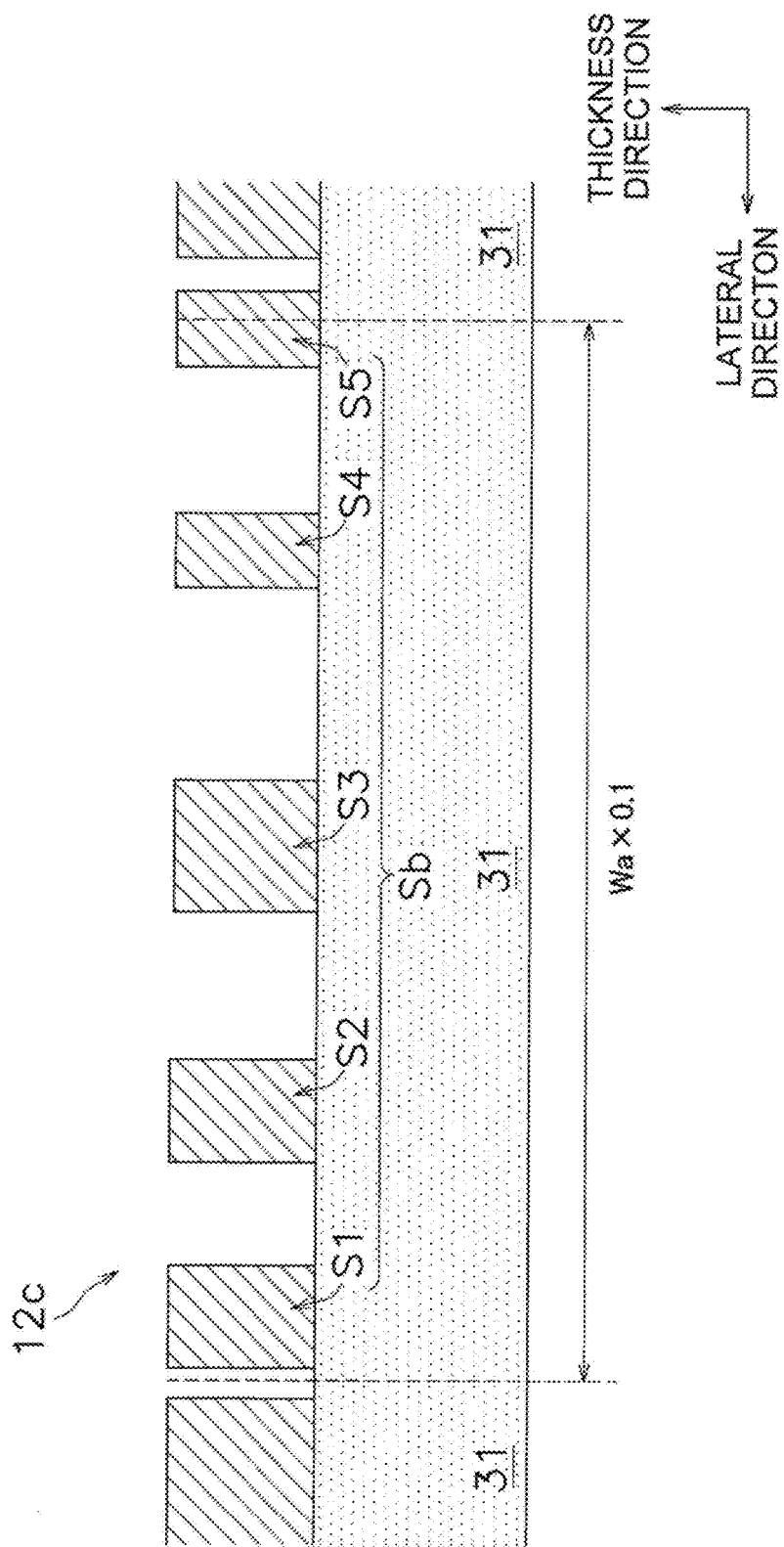
FIG. 4 is a partially enlarged view of FIG. 2.

FIG. 4 is a partially enlarged view of FIG. 2. FIG. 4 schematically illustrates a section view of the inner region 12c.

The inner region 12c is a region that is separated from the interface L5 (reference is made to FIG. 3) of the first active portion 31 and the first inactive portion 41 in the lateral direction of the active electrode portion 12 of the second electrode portion 92. The separation of the inner region 12c is greater than the length (Wb×0.1) of the first interface region 12a from the interface L5.

In the present embodiment, the inner region 12c is formed intermittently. The inner region 12c is not formed in the configuration of a continuous layer. The inner region 12c partially covers the surface of the first active portion 31. The coverage Qa of the surface of the first active portion 31 by the inner region 12c is less than 100%. The coverage Qa of the surface of the first active portion 31 by the inner region 12c may be less than or equal to 95%, is preferably less than or equal to 90%, more preferably less than or equal to 85% and still more preferably less than or equal to 83%.

The inner region 12c has a cross sectional area Sa ($\mu m^2/\mu m$) per unit length in the lateral direction. The cross sectional area Sa ($\mu m^2/\mu m$) per unit length is calculated in the following manner.

Firstly, an SEM image of the cross section of the inner region 12c is obtained. Next, image processing software PickMap is used to adjust the threshold to an RGB average value so that only the inner region 12c on the SEM image is extracted and thereby obtain a binarized SEM image.

Next, the image processing software PickMap is used to calculate the total cross sectional area of the inner region 12c in the length (Wa×0.1) of the first interface region 12a described above. In FIG. 4, the total cross sectional surface area Sb of the inner region 12c in the length (Wa×0.1) of the first interface region 12a is the total of S1, S2, S3, S4 and S5.

Then the cross sectional area Sc ($\mu m^2/\mu m$) per unit length is calculated by dividing the total cross sectional surface area Sb by the length (Wa×0.1) of the first interface region 12a. In FIG. 4, the cross sectional surface area Sc ($\mu m^2/\mu m$) per unit length is the total of (S1+S2+S3+S4+S5)/(Wa×0.1). Furthermore, cross sectional area Sc ($\mu m^2/\mu m$) per unit length in the four cross sections is calculated in the same manner. There is a total of five cross sections that are cross sections obtained by equally dividing the inner region 12c into six portions in a transverse direction that is orthogonal to the longitudinal direction (direction that is vertical with respect to the face of the page in FIG. 4).

The value calculated as the arithmetic mean of the cross sectional area Sc ($\mu m^2/\mu m$) per unit length calculated respectively from the five cross sections is the cross sectional area Sa ($\mu m^2/\mu m$) per unit length of the inner region 12c.

(3) Cross Sectional Surface Area Ra Per Unit Length and Cross Sectional Surface Area Sa Per Unit Length The cross sectional surface area Ra per unit length of the first interface region 12a is greater than the cross sectional surface area Sa per unit length of the inner region 12c.

In this manner, the first interface region 12a has a higher electrode density when compared to the inner region 12c, and therefore a large compressive stress occurs at the site of contact with the first interface region 12a of the first active portion 31 in comparison to the site of contact with the inner region 12c of the first active portion 31. Consequently, when compared to the site of contact with the inner region 12c of the first active portion 31, the site of contact with the first interface region 12a of the first active portion 31 tends to undergo a 90 degree domain rotation in a direction that mitigates the compressive stress (that is to say, a direction of thickness) during polarization. Therefore when an electrical field is applied to the piezoelectric body 3, a small displacement resulting from a 90 degree domain rotation occurs at the site of contact with the first interface region 12a of the first active portion 31, and the overall displacement is small since the displacement resulting from the inverse piezoelectric effect is predominant. As a result, it is possible to inhibit the production of cracks in proximity to the interface L5 between the first active portion 31 and the first inactive portion 41 since it is possible to reduce the stress produced at the interface L5 of the first active portion 31 and the first inactive portion 41. This type of effect is not imparted only by the first interface region 12a, but also results from the first interface region 10a, the second interface region 10b, the first interface region 11a, the second interface region 11b and the second interface region 12b.

Since the electrode density in the inner region 12c is low in comparison to the first interface region 12a, a small compressive stress occurs at the site of contact with the inner region 12c of the first active portion 31 in comparison to the site of contact of the first interface region 12a of the first active portion 31. Consequently, when compared to the site of contact with the first interface region 12a of the first active portion 31, the site of contact with the inner region 12c of the first active portion 31 tends to undergo a 90 degree domain rotation in a direction that mitigates the compressive stress (that is to say, a direction of thickness) during polarization. Therefore when an electrical field is applied to the piezoelectric body 3, a large displacement resulting from a 90 degree domain rotation occurs at the site of contact with the inner region 12c of the first active portion 31, and the overall displacement increases since that displacement predominates over the displacement resulting from the inverse piezoelectric effect. As a result, even when the displacement in the first interface region 12a as described above becomes small, the overall displacement amount of the first active portion 31 can be maintained. This type of effect is not imparted only by the inner region 12c, but also results from the inner region 10c, the inner region 11c, and the inner region 13c.

Although it is sufficient if the cross sectional surface area Ra per unit length to the cross sectional surface area Sa per unit length (Ra/Sa) is greater than 1.0, a value of 1.05 is preferred, and 1.15 more preferred.

(4) Coverage Pa and Coverage Qa

The coverage Pa of the surface of the first active portion 31 due to the first interface region 12a is larger than the coverage Qa of the surface of the first active portion 31 due to the inner region 12c. That is to say, when considered in plain view, the filling rate of the first interface region 12a is greater than the filling rate of the inner region 12c.

Although it is sufficient if the coverage Pa to the coverage Qa (Pa/Qa) is greater than 1.0, a value of 1.05 is preferred, and 1.15 more preferred.

(5) Method of Manufacture of Active Electrode Portion 12

The method of manufacturing the active electrode portion 12 will now be described.

Firstly, a conductive paste including a conductive material such as Pt or the like is prepared.

Next, a green sheet for use in the first active portion 31 is prepared using a slurry of a piezoelectric ceramic material. A green body for the second electrode portion 92 including the active electrode portion 12 is formed by coating the conductive paste using a screen printing method or the like onto the surface of the green sheet. At this time, a screen with a small mesh size is used for coating of the conductive paste onto a region of the surface of the green sheet that forms the inner region 12c and a screen with a large mesh size is used for coating of the conductive paste onto a region of the surface of the green sheet that forms the first interface region 12a and the second interface region 12b. In this manner, the cross section surface area Ra per unit length of the first interface region 12a is greater than the cross section surface area Sa per unit length of the inner region 12c.

Thereafter, the first active portion 31 and the second electrode portion 92 are simultaneously formed by firing (1050 degrees C. to 1250 degrees C., 1 to 4 hours) the green body of the second electrode portion 92 and the green sheet for use in the first active portion 31.

Other Embodiments

The present invention is not limited to the above embodiment, and various changes or modifications may be added within a scope that does not depart from the scope of the invention.

In the above embodiment, the piezoelectric element 1 comprises the first electrode E1 that includes the first inner electrode 5 and the first outer electrode 7, and the second electrode E2 that includes the second inner electrode 15 and the second outer electrode 9. However there is no limitation in this regard. It is sufficient if the piezoelectric element 1 is provided with a pair of electrodes that enable the application of an electrical field to the piezoelectric body 3, and there is no limitation in relation to the related configuration, size, materials, or the like. Therefore the pair of electrodes according to the present invention may be applied to various configurations for a piezoelectric element in addition to the piezoelectric element 1.

In the above embodiment, the active electrode portion 12 of the second electrode portion 92 of the second electrode E2 comprises the first interface region 10a, the second interface region 10b and the inner region 10c. However there is no limitation in this regard, and the active electrode portion 12 may include the inner region 10c and either of the first interface region 10a and the second interface region 10b.

In the above embodiment, the active electrode portion 10 of the first inner electrode 5 of the first electrode E1, the active electrode portion 11 of the third electrode portion 73 of the first electrode E1, the active electrode portion 12 of the second electrode portion 92 of the second electrode E2, and the active electrode portion 13 of the second inner electrode 15 of the second electrode E2 mutually have the same configuration (that is to say, a configuration that includes two interface regions and one inner region). However there is no limitation in this regard. The effect described above will be obtained if any of the active electrode portions of the active electrode portions 10 to 13 include one interface region and one inner region.

In the above embodiment, both the first interface region 12a and the inner region 12c are not formed in a continuous layer configuration in the active electrode portion 12 of the second electrode portion 92 of the second electrode E2. However both those components may be formed in a layer configuration. That is to say, in the cross section of the active electrode portion 12, the coverage Pa of the surface of the first active portion 31 due to the first interface region 12a and the coverage Qa of the surface of the first active portion 31 due to the inner region 12c may be respectively 100%. In this configuration, the cross sectional area Ra per unit length of the first interface region 12a can be configured to be greater than the cross sectional area Sa per unit length of the inner region 12c by adjusting the respective thicknesses of the first interface region 12a and the inner region 12c. The thickness of the first interface region 12a may be configured to be greater than or equal to 1.2 µm, preferably greater than or equal to 1.3 µm, and more preferably greater than or equal to 1.4 µm. The thickness of the inner region 12c may be configured to be less than or equal to 0.9 µm, preferably less than or equal to 0.8 µm, and more preferably less than or equal to 0.7 µm.

In the above embodiment, there is no particular description of the respective configurations of the inactive electrode portion 20 of the first inner electrode 5 of the first electrode E1, the inactive electrode portion 21 of the third electrode portion 73 of the first electrode E1, the inactive electrode portion 22 of the second electrode portion 92 of the second electrode E2, and the inactive electrode portion 23 of the second inner electrode 15 of the second electrode E2. However it is sufficient if the inactive electrode portions 20 to 23 include a configuration (electrode density) that is the same as the first interface region 12a or the second interface region 12b, or a configuration (electrode density) that is the same as the inner region 12c.

In the above embodiment, the length in the lateral direction of the respective interface regions included in each active electrode portion is 10% of the total length of the active portion in contact with each active electrode portion, and the length in the lateral direction of each inner region contained in each active electrode portion is 80% of the total length of the active portion in contact with each active electrode portion. However there is no limitation in this regard. It is sufficient if the length in the lateral direction of each interface region is greater than or equal to 10% of the total length of the active portion in contact with each active electrode portion, and it is sufficient if the length in the lateral direction of each inner region is greater than or equal to 10% of the total length of the active portion in contact with each active electrode portion.

EXAMPLES

Examples according to the present invention will be described below. However, the present invention is not limited to the examples that are described below.

Preparation of Examples 1 to 3

Figure 5:
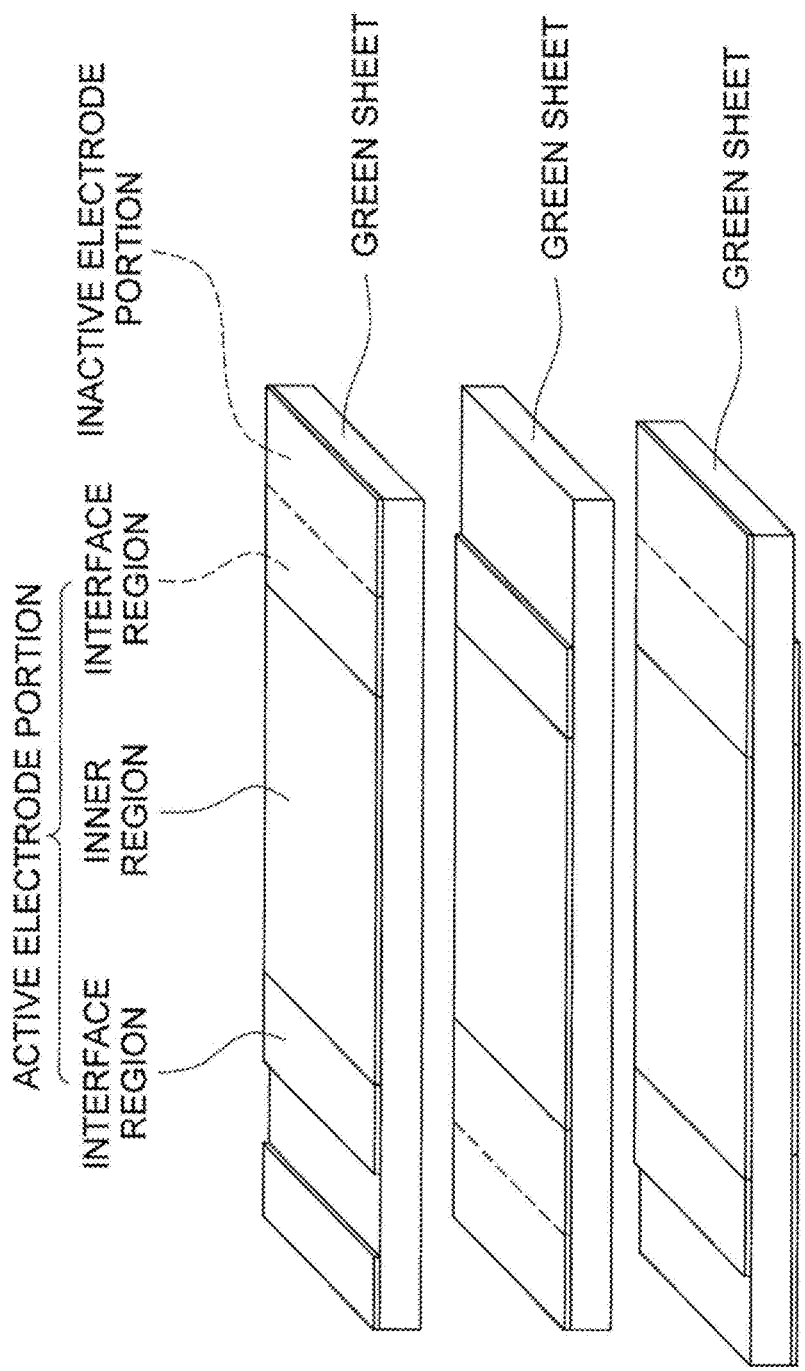
FIG. 5 illustrates a method of manufacture of the piezoelectric element according to a first embodiment.

FIG. 5 illustrates a method of manufacture of the piezoelectric element according to Examples 1 to 3.

Firstly, three green sheets for use in relation to the piezoelectric body are prepared by use of a slurry containing a mixture of 500 g of a PZT powder as a main component, a carrying liquid, a dispersion agent and a plasticizing agent.

A conductive paste including Pt is printed in a predetermined pattern onto the surface of the three green sheets for use in relation to the piezoelectric body. At that time, as shown in FIG. 5, an active electrode portion and an inactive electrode portion are integrally formed, and a pair of interface regions, and an inner region are integrally formed in the active electrode portion. The respective length of the pair of interface regions is configured to be 10% of the length of the region forming the active portion of the green sheet for the piezoelectric body, and the length of the inner region is configured to be 80% of the length of the region forming the active portion of the green sheet for the piezoelectric body.

Furthermore, a screen having a small mesh size is used for coating of the inner region and a screen having a large mesh size is used for coating of the pair of interface regions. In this manner, as described above, the cross sectional area Ra per unit length in the respective pair of interface regions is greater than the cross sectional area Sa per unit length in the inner region.

Next, a stacked body is formed by thermal compression of the three green sheets for use in relation to the piezoelectric body after printing with the conductive paste. In addition, the conductive paste is printed onto both side surfaces of the stacked body (reference is made to FIG. 1).

Then, the stacked body after printing with the conductive paste is fired (1150 degrees C., 2 hours) to prepare a piezoelectric element that includes a Pt electrode. The size of the piezoelectric element according to example 1 has a length of 1.0 mm×width 0.3 mm×thickness 0.08 mm.

Preparation of Comparative Examples 1 to 3

Figure 6:
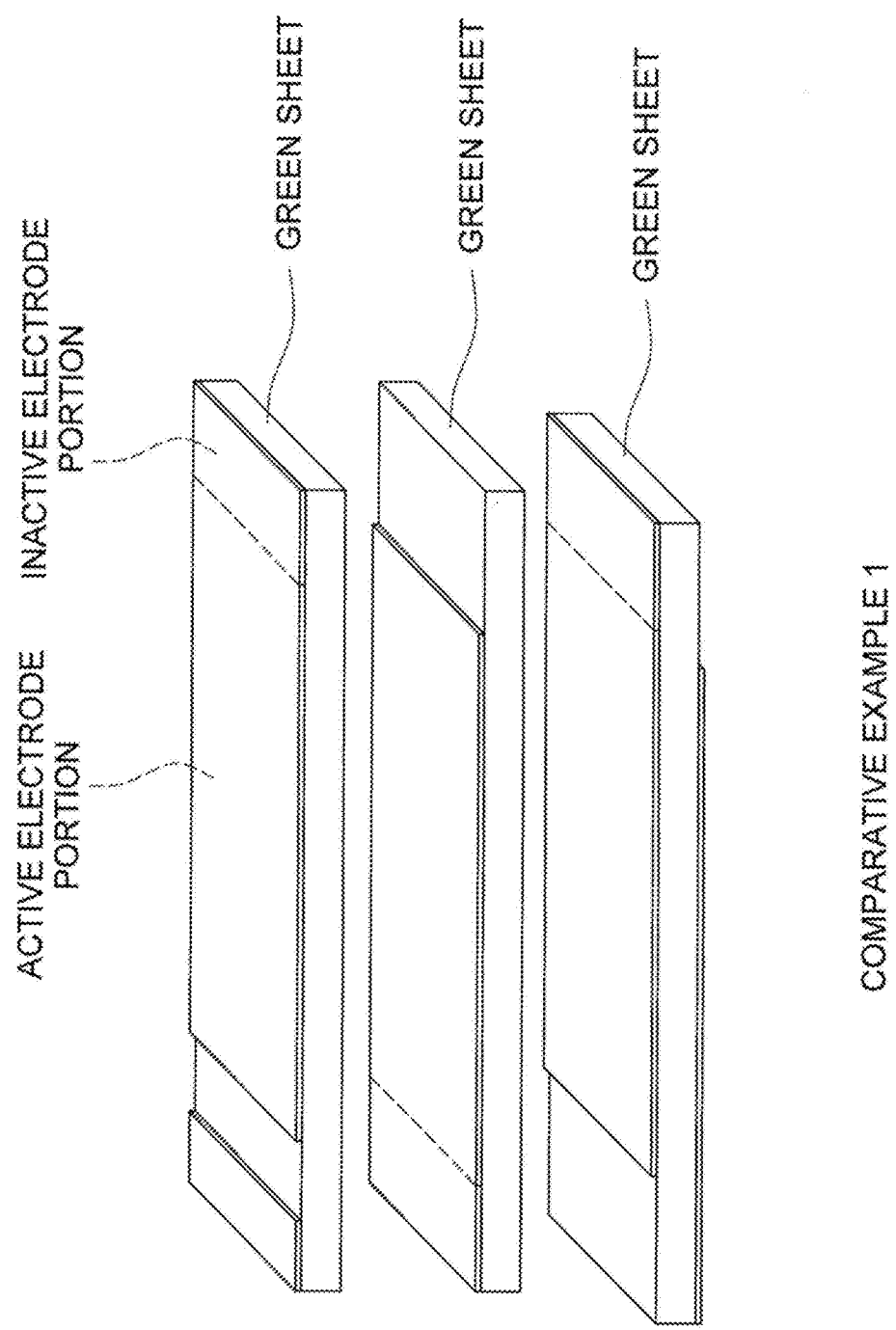
FIG. 6 illustrates a method of manufacture of the piezoelectric element according to a first comparative example.

FIG. 6 illustrates a method of manufacture of the piezoelectric element according to Comparative Examples 1 to 3.

As illustrated in FIG. 6, in Comparative Examples 1 to 3, the active electrode portion and the inactive electrode portion are integrally formed, and the overall body is formed by use of a screen having a uniform mesh size by the formation conditions for the inner region as described in Example 1. In other respects, a piezoelectric element is prepared that is the same as Example 1. The size of the piezoelectric element according to Comparative Examples 1 to 3 is the same as the size of the Comparative Examples 1 to 3 according to Examples 1 to 3.

Measurement of Coverage and Cross Sectional Surface Area (1) Acquisition of SEM Image Examples 1 to 3 and Comparative Examples 1 to 3 are cut along the longitudinal direction (reference is made to FIG. 2), and the cross section of the inner region and interface regions of the active electrode portion of the Pt electrode is observed using an SEM. The object to be observed coincides with the active electrode portion 10 of the first inner electrode 5 of the first electrode E1 illustrated in FIG. 2.

Figure 7:
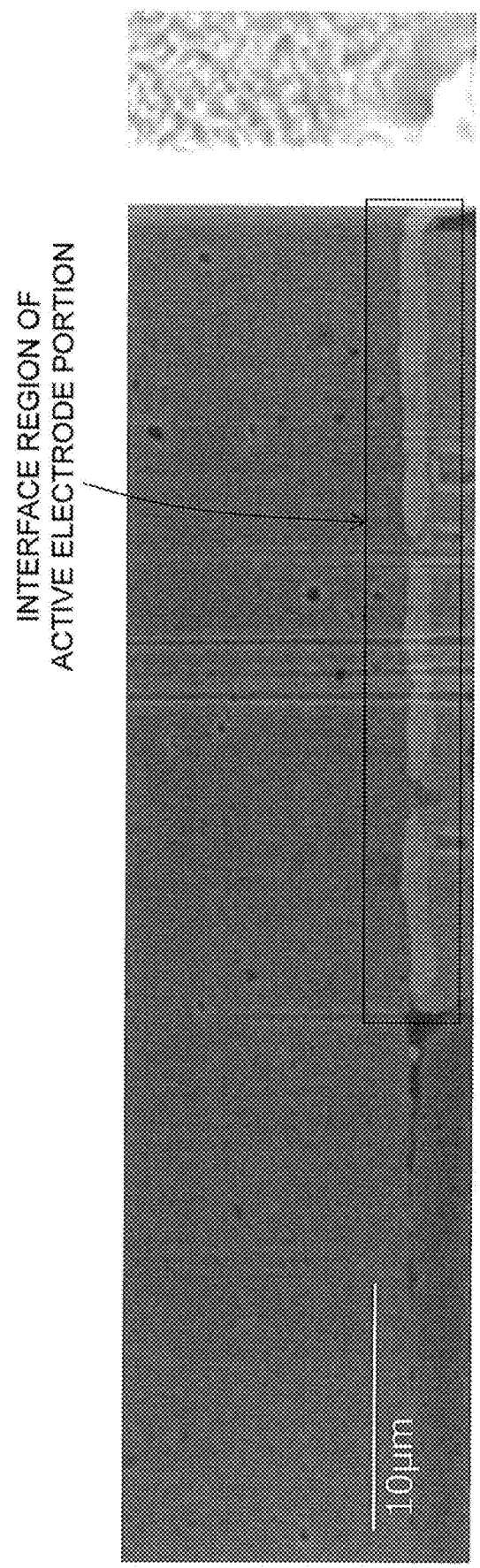
FIG. 7 is a cross-sectional SEM image of an interface region in the active electrode portion.
Figure 8:
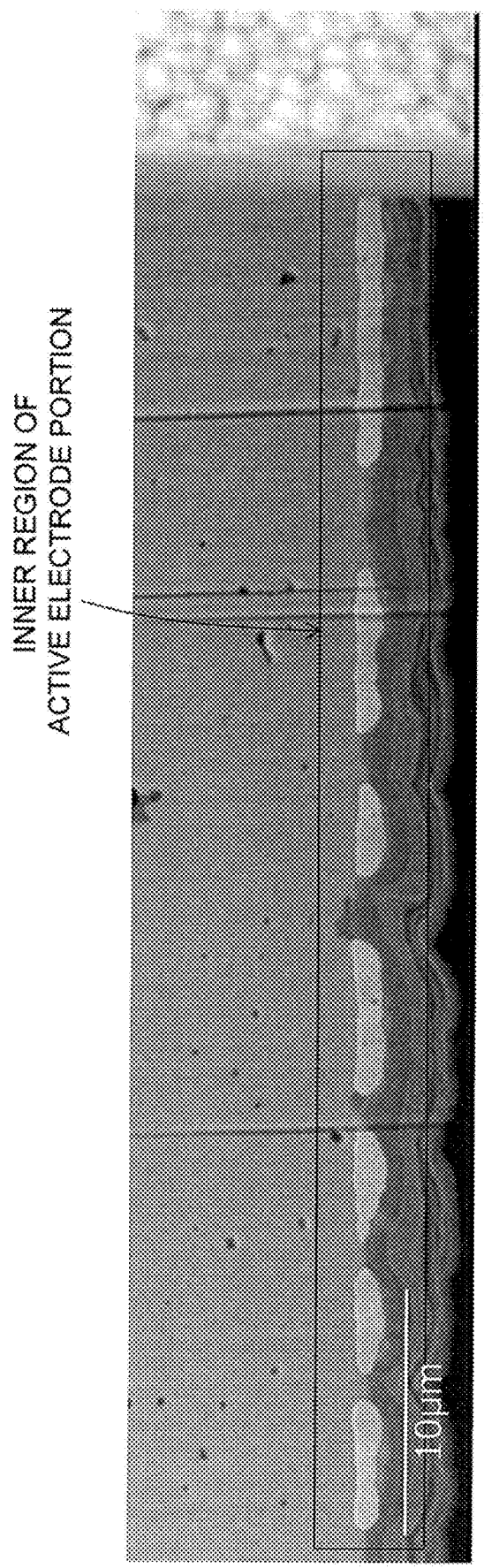
FIG. 8 is a cross-sectional SEM image of an inner region in the active electrode portion.

FIG. 7 is a cross-sectional SEM image of an interface region in the active electrode portion. FIG. 8 is a cross-sectional SEM image of an inner region in the active electrode portion.

As shown in FIG. 7 and FIG. 8, the inner region is confirmed to be formed with a low density relative to the high-density formation of the interface region.

(2) Cross Sectional Area Ra Per Unit Length in Interface Region

Firstly image processing software PickMap is used to adjust the threshold to an RGB average value so that only the interface region on the cross sectional SEM image of the interface region is extracted and thereby obtain a binarized cross sectional SEM image. Then, the image processing software PickMap is used to calculate the total cross sectional surface area Rb of the interface region.

Next, the cross sectional area Rc ($\mu m^2/\mu m$) per unit length is calculated by dividing the total cross sectional surface area Rb of the interface region by the total length (length of the piezoelectric body active portion) of the interface region. The cross sectional surface area Rc per unit length ($\mu m^2/\mu m$) of the four cross sections is calculated in the same manner. There is a total of five cross sections that are cross sections obtained by equally dividing the interface region into six portions in a transverse direction that is orthogonal to the longitudinal direction. A cross sectional area Ra ($\mu m^2/\mu m$) per unit length of the interface region is obtained as the arithmetic mean of the cross sectional area Rc ($\mu m^2/\mu m$) per unit length calculated respectively for the five cross sections.

(3) Coverage of Piezoelectric Body Active Portion by Interface Region

Furthermore the coverage of the piezoelectric body active portion by the interface region is obtained by calculation of the proportion of the total contact length of the piezoelectric body active portion relative to the total length (10% length of the piezoelectric body active portion) of the interface region based on a cross sectional SEM image of the interface region.

(4) Cross Sectional Area Sa Per Unit Length in Interface Region

Firstly the image processing software PickMap is used to adjust the threshold to an RGB average value so that only the inner region on the cross sectional SEM image of the inner region is extracted and thereby obtain a binarized cross sectional SEM image. Then, the image processing software PickMap is used to calculate the total cross sectional surface area Sb of the inner region.

Then the cross sectional area Sc ($\mu m^2/\mu m$) per unit length is calculated by dividing the total cross sectional surface area Sb by the total length (10% length of the piezoelectric body active portion) of the interface region. The cross sectional surface area Sc per unit length ($\mu m^2/\mu m$) of the four cross sections is calculated in the same manner. There is a total of five cross sections that are cross sections obtained by equally dividing the inner region into six portions in a transverse direction that is orthogonal to the longitudinal direction. A cross sectional area Sa ($\mu m^2/\mu m$) per unit length of the inner region is obtained as the arithmetic mean of the cross sectional area Sc ($\mu m^2/\mu m$) per unit length calculated respectively for the five cross sections.

(5) Coverage of Piezoelectric Body Active Portion by Inner Region

Furthermore the coverage of the piezoelectric body active portion by the inner region is obtained by calculation of the proportion of the total contact length of the piezoelectric body active portion relative to the total length (80% length of the piezoelectric body active portion) of the inner region based on a cross sectional SEM image of the inner region.

Observation of Cracks in Piezoelectric Body

After continuous operation of the piezoelectric element according to Examples 1 to 3 and Comparative Examples 1 to 3 under predetermined conditions (10 kHz, 100 hours, ±1 kV/mm), an electron microscope is used to confirm the presence or absence of cracks (at least of a length of 5 µm, and at least a width of 1 µm) in proximity to the interface of the piezoelectric body active portion and the piezoelectric body inactive portion. In Table 1, broken product rate when counting a piezoelectric element with even one confirmed crack as a broken product in 50 respective positions on the piezoelectric element in Example and the piezoelectric body in Comparative Example is shown. The object for observation coincides with the interface L6 of the first active portion 31 and the third inactive portion 43 shown in FIG. 2.

the interface region of the active portion as a result of the high electrode density of the interface region, the 90 degree domain rotation during polarization is promoted, and as a result, the displacement due to the 90 degree domain rotation is reduced in the region of the active portion in contact with the interface region.

The invention claimed is:

1. A piezoelectric element comprising;
   a piezoelectric body extending in a lateral direction, and
   a first and second electrodes provided on the piezoelectric body,
   the piezoelectric body having an active portion sandwiched between the first and second electrodes in a thickness direction vertical to the lateral direction, and an inactive portion connected to the active portion in the lateral direction,
   the first electrode having an active electrode portion disposed on the active portion,
   the active electrode portion including an interface region adjacent to the interface of the active portion and the inactive portion in the lateral direction, and an inner region separated from the interface of the active portion and the inactive portion in the lateral direction,
   a cross sectional surface area per unit length of the interface region in the cross section of the active electrode portion being greater than a cross sectional area per unit length of the inner region.

2. The piezoelectric element according to claim 1, wherein
   a surface coverage of the active portion by the interface region is greater than a surface coverage of the active portion by the inner region.

3. The piezoelectric element according to claim 2, wherein
   the surface coverage of the active portion by the interface region is greater than or equal to 90%, and
   the surface coverage of the active portion by the inner region is less than or equal to 85%.

4. The piezoelectric element according to claim 1, wherein
   a thickness of the interface region is greater than a thickness of the inner region.

5. The piezoelectric element according to claim 4, wherein

TABLE 1

| | Thickness of Interface Region (um) | Thickness of Inner Region (um) | Surface Coverage of Interface Region | Surface Coverage of Inner Region | Cross Sectional Surface Area Ra per Unit Length of Interface Region ($\mu m^2/\mu m$) | Cross Sectional Surface Area Sa per Unit Length of Inner Region ($\mu m^2/\mu m$) | Broken Rate in Piezoelectric Element |
|---|---|---|---|---|---|---|---|
| Example 1 | 0.85 | 0.80 | 94% | 78% | 0.90 | 0.70 | 0% |
| Example 2 | 0.85 | 0.85 | 91% | 82% | 0.85 | 0.75 | 0% |
| Example 3 | 1.20 | 0.80 | 85% | 85% | 0.90 | 0.75 | 0% |
| Comparitive Example 1 | 0.80 | 0.80 | 78% | 79% | 0.70 | 0.70 | 6% |
| Comparitive Example 2 | 0.80 | 0.80 | 78% | 82% | 0.70 | 0.75 | 6% |
| Comparitive Example 3 | 0.90 | 0.75 | 75% | 89% | 0.75 | 0.75 | 4% |

As shown in Table 1, the production of cracks in proximity to the interface of the piezoelectric body active portion and the piezoelectric body inactive portion is inhibited in Examples 1 to 3 in which the cross sectional surface area Ra per unit length in the interface region is greater than the cross sectional surface area Sa per unit length in the inner region. This feature is due to the fact that since a large compressive stress is exerted in the region in contact with the thickness of the interface region is greater than or equal to 1.2 µm, and
the thickness of the inner region is less than or equal to 0.9 µm.

6. The piezoelectric element according to claim 1, wherein
   a thickness of the active portion is less than or equal to 2.0 µm.

7. The piezoelectric element according to claim 1 configured to be driven by an applied electrical field of greater than or equal to 0.4 kV/mm.

\* \* \* \* \*